United States Patent
Alam et al.

(10) Patent No.: US 9,502,093 B2
(45) Date of Patent: Nov. 22, 2016

(54) METHOD OF WRITING TO A SPIN TORQUE MAGNETIC RANDOM ACCESS MEMORY

(71) Applicant: Everspin Technologies, Inc., Chandler, AZ (US)

(72) Inventors: Syed M. Alam, Austin, TX (US); Thomas Andre, Austin, TX (US);
(Continued)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 15/167,758

(22) Filed: May 27, 2016

(65) Prior Publication Data
US 2016/0276012 A1    Sep. 22, 2016

Related U.S. Application Data

(60) Division of application No. 14/970,563, filed on Dec. 16, 2015, now Pat. No. 9,378,798, which is a division
(Continued)

(51) Int. Cl.
*G11C 11/00* (2006.01)
*G11C 11/16* (2006.01)

(52) U.S. Cl.
CPC ........ *G11C 11/1675* (2013.01); *G11C 11/1673* (2013.01); *G11C 11/1693* (2013.01)

(58) Field of Classification Search
CPC ...................................................... G11C 11/00
(Continued)

(56) References Cited

U.S. PATENT DOCUMENTS

| 6,304,482 B1 | 10/2001 | Lin et al. |
| 6,400,633 B1 | 6/2002 | Al-Shamma et al. |
| 7,203,794 B2 | 4/2007 | Ji et al. |

(Continued)

OTHER PUBLICATIONS

The International Bureau of WIPO, International Preliminary Report on Patentability in PCT International Application No. PCT/US2012/023316, mailed Aug. 15, 2013.
(Continued)

*Primary Examiner* — Harry W Byrne

(57) ABSTRACT

A spin-torque magnetoresistive memory includes array read circuits and array write circuits coupled to an array of magnetic bits. The array read circuits sample magnetic bits in the array, apply a write current pulse to the magnetic bits to set them to a first logic state, resample the magnetic bits using an additional offset current, and compare the results of sampling and resampling to determine the bit state for each magnetic bit. For each of the magnetic bits in the page having the second logic state, the array write circuits initiate a write-back, wherein the write-back includes applying a second write current pulse having opposite polarity in comparison with the first write current pulse to set the magnetic bit to the second state. A read or write operation may be received after initiation of the write-back where the write-back can be aborted for a portion of the bits in the case of a write operation. The write-back may be performed such that different portions of the magnetic bits are written back at different times, thereby staggering the write-back current pulses in time.

20 Claims, 4 Drawing Sheets

(72) Inventors: Matthew R. Croft, Austin, TX (US); Chitra Subramanian, Mahopac, NY (US); Halbert Lin, Austin, TX (US)

Related U.S. Application Data of application No. 14/702,828, filed on May 4, 2015, now Pat. No. 9,245,611, which is a continuation of application No. 14/452,071, filed on Aug. 5, 2014, now Pat. No. 9,047,969, which is a division of application No. 13/362,599, filed on Jan. 31, 2012, now Pat. No. 8,811,071.

(60) Provisional application No. 61/438,009, filed on Jan. 31, 2011.

(58) Field of Classification Search
USPC ....... 365/48, 55, 62, 66, 74, 78, 80–93, 100, 365/130, 131, 148, 158, 171–173, 209, 213, 365/225.5, 230.07, 232, 243.5; 216/22; 257/295, 421, 422, 427, E21.665, 257/E27.006; 438/3; 428/810–816, 428/817–825.1, 826; 977/933–935
See application file for complete search history.

(56) References Cited

U.S. PATENT DOCUMENTS

| | | | |
|---|---|---|---|
| 7,203,886 B2 | 4/2007 | Brown et al. | |
| 8,228,715 B2* | 7/2012 | Andre et al. | 365/158 |
| 8,811,071 B2 | 8/2014 | Alam et al. | |
| 9,047,969 B2 | 6/2015 | Alam et al. | |
| 9,245,611 B2 | 1/2016 | Alam et al. | |
| 9,378,798 B2 | 6/2016 | Alam et al. | |
| 2002/0161967 A1 | 10/2002 | Kirihata et al. | |
| 2003/0023927 A1 | 1/2003 | Jedwab et al. | |
| 2005/0204091 A1 | 9/2005 | Kilbuck et al. | |
| 2005/0276100 A1 | 12/2005 | Yang et al. | |
| 2009/0190391 A1* | 7/2009 | Itagaki et al. | 365/158 |
| 2010/0118583 A1 | 5/2010 | Hung et al. | |
| 2010/0142260 A1 | 6/2010 | Yoon et al. | |
| 2010/0332900 A1 | 12/2010 | Yang | |
| 2011/0292714 A1* | 12/2011 | Andre et al. | 365/148 |
| 2012/0081950 A1* | 4/2012 | Slaughter | 365/158 |
| 2012/0195112 A1 | 8/2012 | Alam et al. | |
| 2012/0198313 A1* | 8/2012 | Alam et al. | 714/773 |

OTHER PUBLICATIONS

United States Patent Office, International Searching Authority, International Search Report mailed May 16, 2012; International Appln. No. PCT/US2012/23316, filed Jan. 31, 2012.

European Patent Office, Supplemental Partial European Search Report in Application No. EP 12 74 2660, mailed Feb. 29, 2016.

* cited by examiner

100

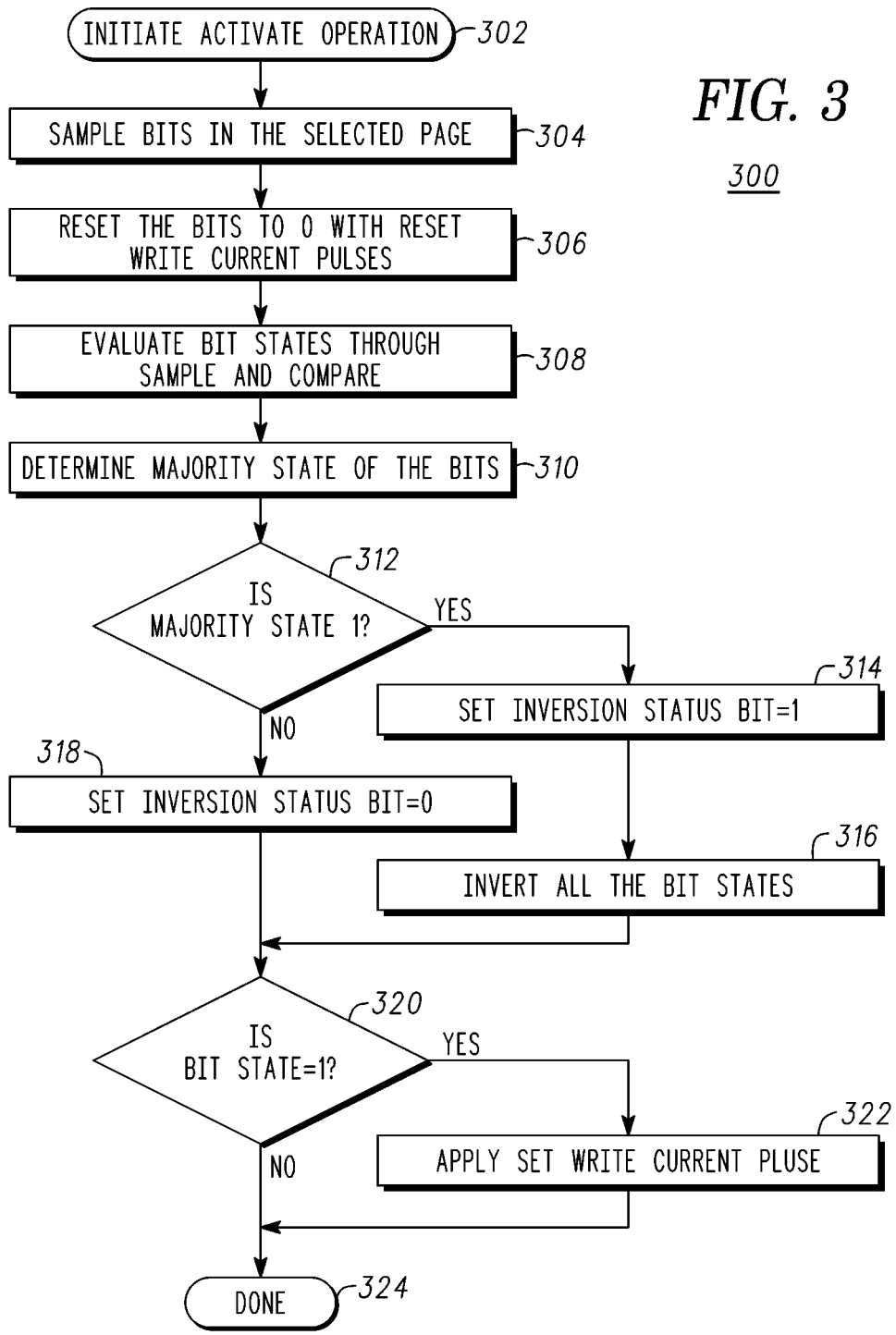

METHOD OF WRITING TO A SPIN TORQUE MAGNETIC RANDOM ACCESS MEMORY

This application is a divisional of U.S. patent application Ser. No. 14/970,563 filed Dec. 16, 2015. Application Ser. No. 14/970,563 is a divisional of U.S. patent application Ser. No. 14/702,828 filed May 4, 2015, which issued as U.S. Pat. No. 9,245,611 on Jan. 26, 2016. Application Ser. No. 14/702,828 is a continuation of U.S. patent application Ser. No. 14/452,071 filed Aug. 5, 2014, which issued as U.S. Pat. No. 9,047,969 on Jun. 2, 2015. Application Ser. No. 14/452,071 is a divisional of U.S. patent application Ser. No. 13/362,599 filed Jan. 31, 2012, which issued as U.S. Pat. No. 8,811,071 on Aug. 19, 2014. This application and application Ser. Nos. 14/970,563, 14/702,828, 14/452,071 and 13/362,599 claim priority to and the benefit of U.S. Provisional Application No. 61/438,009, filed Jan. 31, 2011. The contents of application Ser. Nos. 14/970,563, 14/702,828, 14/452,071, 13/362,599, and 61/438,009 are incorporated by reference herein in their entirety.

TECHNICAL FIELD

The exemplary embodiments described herein generally relate to integrated magnetic devices and more particularly relate to programming methods for magnetoresistive memories.

BACKGROUND

Magnetoelectronic devices, spin electronic devices, and spintronic devices are synonymous terms for devices that make use of effects predominantly caused by electron spin. Magnetoelectronics are used in numerous information devices to provide non-volatile, reliable, radiation resistant, and high-density data storage and retrieval. The numerous magnetoelectronics information devices include, but are not limited to, Magnetoresistive Random Access Memory (MRAM), magnetic sensors, and read/write heads for disk drives.

Typically an MRAM includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low (logic "0" state) and high (logic "1" state) electrical resistance states, respectively. Accordingly, a detection of the resistance allows a magnetoresistive memory element, such as an MTJ device, to provide information stored in the magnetic memory element. There are two completely different methods used to program the free layer: field switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The angular momentum carried by the spin-polarized tunneling current causes reversal of the free layer, with the final state (parallel or antiparallel) determined by the polarity of the current pulse. A reset current pulse will cause the final state to be parallel or logic "0". A set current pulse, in the opposite polarity of reset current pulse, will cause the final state to be antiparallel or logic "1". Spin-torque transfer is known to occur in MTJ devices and giant magnetoresistance devices that are patterned or otherwise arranged so that the current flows substantially perpendicular to the interfaces, and in simple wire-like structures when the current flows substantially perpendicular to a domain wall. Any such structure that exhibits magnetoresistance has the potential to be a spin-torque magnetoresistive memory element.

Spin-torque MRAM (ST-MRAM), also known as spin-torque-transfer RAM (STT-RAM), is an emerging memory technology with the potential for non-volatility with unlimited endurance and fast write speeds at much higher density than field-switched MRAM. Since ST-MRAM switching current requirements reduce with decreasing MTJ dimensions, ST-MRAM has the potential to scale nicely at even the most advanced technology nodes. However, increasing variability in MTJ resistance and sustaining relatively high switching currents through bitcell select devices in both current directions can limit the scalability of ST-MRAM. The write current is typically higher in one direction compared to the other, so the select device must be capable of passing the larger of the two currents. In addition, ST-MRAM switching current requirements increase as the write current pulse duration is reduced. Because of this, the smallest ST-MRAM bitcell approach may require relatively long switching times.

Data stored in memory is defined in banks. A rank is a plurality of banks in a first direction (column) and a channel is a plurality of banks in a second direction (row). A process for accessing the memory comprises several clock cycles required for row and column identification and a read or write operation. The bandwidth for the data transfer may comprise a row of many thousands of bits.

Access to a bank in a double data rate (DDR) memory generally includes an ACTIVATE operation, followed by several READ/WRITE operations and a PRECHARGE operation. The ACTIVATE operation opens a row (or page) of typically 1,000 or more bits. The READ/WRITE operation performs the reading or writing of columns, e.g., 128 bits, in the open row. The PRECHARGE operation closes the row.

During the ACTIVATE operation, a page of data is read from the memory array and stored in local data-store latches for subsequent READ and WRITE operations from and to the local data-store latches. The ACTIVATE operation can be initiated by an ACTIVATE command or any other command that performs the same operation. During a PRECHARGE operation, the data from local data-store latches are written back to the memory array, and as a result, that page is considered closed or not accessible without a new ACTIVATE operation. The PRECHARGE operation can be initiated by a PRECHARGE or AUTO-PRECHARGE command or any other command that performs the same operation. During the PRECHARGE operation in ST-MRAM, current pulses to write the MTJs corresponding to the open row would be applied to write-back the data from the local data-store latches to ST-MRAM array.

However, the peak current during the closing of all open rows in different banks (PRECHARGE) can be very high, e.g., for a current pulse of 300 micro amps, a page size of 1000, the peak current during an eight bank PRECHARGE phase would be 2.4 amps. Furthermore, until the PRECHARGE operation is complete (write-back to ST-MRAM), the memory is volatile. And ST-MRAM write pulses, for e.g. of 10 nanoseconds or more, may not be suitable for real-time write-back when the WRITE operations to the local data-store latches have a minimum interval of 5 nanoseconds.

Accordingly, it is desirable to provide a method of reducing peak write current, managing the longer write pulse durations during the short interval of WRITE operations to the local data-store latches, and enabling the non-volatility of the open row. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A method and apparatus are provided for programming and reading a spin-torque magnetoresistive random access memory.

A first exemplary embodiment includes destructively reading the bits in the spin-torque magnetoresistive memory array, each bit having a first or a second value; providing first write-back current pulses while simultaneously aborting the write back current pulses for a portion of the plurality of bits in response to a write operation to the same portion; and providing second write current pulses according to the new value only for the same portion of the plurality of the bits.

A second exemplary embodiment includes destructively reading the bits in the spin-torque magnetoresistive memory array; destructively reading a portion immediately followed by a write-back current pulses; conducting write operation with new data for a portion of the plurality of bits writing new data states to a local data-store latches; and initiating write current pulses at a later time according to the data states from the local data-store latches if the data states from the local data-store latches are different in states from read memory states during destructive read.

A third exemplary embodiment includes sampling the bits in the spin-torque magnetoresistive memory array; setting the bits to a first state in the spin-torque memory array; resampling the bits to evaluate the states of the bits; storing a value of each of the bits in one of a plurality of latches, the value being either a first state or a second state; reading the state of the bits in the latches; and initializing a first resetting of the bits in the spin-torque magnetoresistive memory array to the second state if a stored value for a bit was the second state in the plurality of latches.

A fourth exemplary embodiment includes sampling the bits in the spin-torque magnetoresistive memory array; setting the bits to a first state in the spin-torque memory array; resampling the bits to evaluate the states of the bits as either a first or second state; detecting which of the first or second states of the bits is a majority; inverting the states if the second state is detected as the majority state; resetting the bits in the spin-torque magnetoresistive memory array to the second state if inverted state of a bit was the second state; aborting the resetting step for a portion of the plurality of the bits if a subsequent write operation is received; inverting the first and second states for the subsequent write operation if the second state was detected as the majority state in the majority detection step above; and resetting the bits to either first or second states for the portion of the plurality of the bits in the spin-torque magnetoresistive memory array according to the inverted data states.

A fifth exemplary embodiment includes sampling the bits in the spin-torque magnetoresistive memory array; setting the bits to a first state in the spin-torque magnetoresistive memory array; resampling the bits to evaluate the states of the bits to either a first or second state; detecting which of the first or second states of the bits is a majority; inverting the states if the second state is detected as the majority state; resetting the bits in the spin-torque magnetoresistive memory array to the second state if inverted state of a bit was the second state; initiating a programmable delay if a subsequent write operation is received for a portion of the plurality of the bits; storing multiple write operations for different portions of the plurality of the bits; aborting the resetting step for the different portions of the plurality of the bits if the resetting step for the same different portions of the plurality of the bits is ongoing; and initiating new resetting operations for the same different portions of the plurality of the bits to either first or second states, A sixth exemplary embodiment includes sampling the bits in the spin-torque magnetoresistive memory array; setting the bits to a first state in the spin-torque magnetoresistive memory array; resampling the bits to resolve the states of the bits to either a first or second state; detecting which of the first or second states of the bits is a majority; inverting the states if the second state is detected as the majority state; resetting the bits in the spin-torque magnetoresistive memory array to the second state if inverted state of a bit was the second state; initiating a programmable delay if a subsequent write operation is received for a portion of the plurality of the bits; storing multiple write operations to the same portion of the plurality of the bits; aborting the resetting step for the same portion of the plurality of the bits if the resetting step for the same portion of the plurality of the bits is ongoing; and initiating new resetting operations for the same portion of the plurality of the bits to either first or second states according to the subsequent write operations, A seventh exemplary embodiment includes a system for reading a first or second state for each of a plurality of bits of a spin-torque magnetoresistive memory array, comprising a plurality of latches; and a processor configured to sample the bits in the spin-torque magnetoresistive memory array; set the bits in the spin-torque magnetoresistive memory array to a first state; resample the bits to evaluate the bit states to either a first or second state; store a value of each of the bits in one of the latches, the value being either a first state or a second state; read the state of the bits in the latches; and reset the bits in the spin-torque magnetoresistive memory array to the second state if a stored value for a bit was the second state in the plurality of latches.

BRIEF DESCRIPTION OF THE DRAWINGS

The present invention will hereinafter be described in conjunction with the following drawing figures, wherein like numerals denote like elements.

FIG. 3 is a flow chart of the steps for destructive read with immediate write-back in ST-MRAM occurring during ACTIVATE operation in accordance with a second exemplary embodiment;

DETAILED DESCRIPTION

Figure 1:
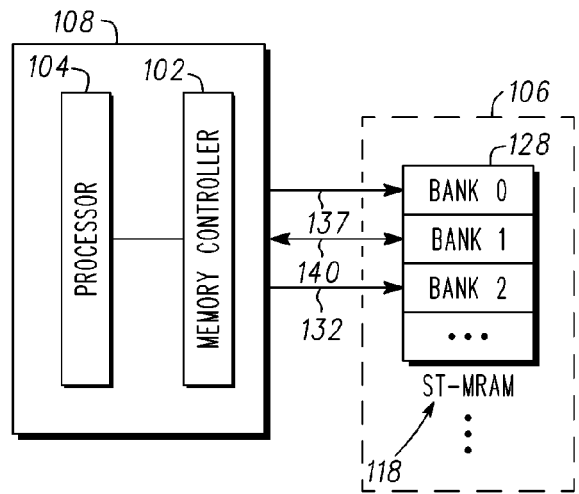
FIG. 1 is a block diagram of a memory interconnection system comprising of a memory controller between a processor and non-volatile memory that may be used to apply the methods in accordance with the exemplary embodiments.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

A method of programming non-volatile memory includes a destructive read of ST-MRAM cells in an addressed page with reset (MTJ written to logic "0") write current pulses during an ACTIVATE operation, immediately followed by a write-back comprising of only a conditional set (MTJ written to logic "1") write current pulses if a read state is logic "1". A subsequent WRITE operation with a new value for a portion of the open page can abort ongoing write current pulses only to the addressed portion without affecting the rest of the write current pulses if in progress. New set or reset write current pulses are initiated according to new value only for the addressed portion of data either immediately or within a specified time of a look-ahead period to poll for any pending WRITE operation prior to starting new set or reset write current pulses in response to the original WRITE operation. The write-back portion of the ACTIVATE operation further employs majority bit detection and inversion of write data to minimize the number of write-back set write current pulses. The set or reset write current pulses due to any subsequent WRITE operation follow the majority bit detection output and inversion polarity (inversion or no inversion of the new data) of the write-back data from the ACTIVATE operation. One page or row worth of data read during an ACTIVATE operation in ST-MRAM array is organized into multiple error correcting code (ECC) words and a plurality of inversion status bits. Each ECC word or a group of ECC words has its own write-clock phase generator block to support the aforementioned write-abort feature.

For simplicity and clarity of illustration, the drawing figures depict the general structure and/or manner of construction of the various embodiments. Descriptions and details of well-known features and techniques may be omitted to avoid unnecessarily obscuring other features. Elements in the drawings figures are not necessarily drawn to scale: the dimensions of some features may be exaggerated relative to other elements to assist improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices.

During the course of this description, like numbers may be used to identify like elements according to the different figures that illustrate the various exemplary embodiments.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, resistive, or organic properties corresponding to the data bits. It should be appreciated that the various clock, signal, logic, and functional components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

For the sake of brevity, conventional techniques related to programming memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

A magnetoresistive random access memory (MRAM) array includes write current drivers and sense-amplifiers positioned near a plurality of magnetoresistive bits. A write, or program, operation begins when a current of either one of the two different and opposite polarities, set or reset, is applied through the magnetic storage element, e.g., MTJ. Such write mechanism is employed in spin torque transfer (STT) or spin torque (ST) MRAM. The spin-torque effect is known to those skilled in the art. Briefly, a current becomes spin-polarized after the electrons pass through the first magnetic layer in a magnetic/non-magnetic/magnetic tri-layer structure, where the first magnetic layer is substantially more stable than the second magnetic layer. The higher stability of the first layer compared to the second layer may be determined by one or more of several factors including: a larger magnetic moment due to thickness or magnetization, coupling to an adjacent antiferromagnetic layer, coupling to another ferromagnetic layer as in a SAF structure, or a high magnetic anisotropy. The spin-polarized electrons cross the nonmagnetic spacer and then, through conservation of spin angular momentum, exert a spin torque on the second magnetic layer that causes precession of its magnetic moment and switching to a different stable magnetic state if the current is in the proper direction. When net current of spin-polarized electrons moving from the first layer to the second layer exceeds a first critical current value, the second layer will switch its magnetic orientation to be parallel to that of the first layer. If a bias of the opposite polarity is applied, the net flow of electrons from the second layer to the first layer will switch the magnetic orientation of the second layer to be antiparallel to that of the first layer, provided the magnitude of the current is above a second critical current value. Switching in this reverse direction involves a fraction of the electrons reflecting from the interface between the spacer and the first magnetic layer and traveling back across the nonmagnetic spacer to interacting with the second magnetic layer.

Magnetoresistance is the property of a material to change the value of its electrical resistance depending on its magnetic state. Typically, for a structure with two ferromagnetic layers separated by a conductive or tunneling spacer, the resistance is highest when the magnetization of the second magnetic layer is antiparallel to that of the first magnetic layer, and lowest when they are parallel.

FIG. 1 is a block diagram of an exemplary memory system 100 including a memory controller 102 that performs data transfer between a processor 104 and the memory 106. The memory controller 102 and the processor 104 may reside on the same chip 108, or they may reside on separate chips (not shown). The memory 106 comprises a non-volatile memory 118 using magnetic tunnel junctions, preferably ST-MRAM, for data storage. The non-volatile memory 118 comprises a plurality of non-volatile memory banks 128.

A chip select (CS) line 132 provides a CS signal from the memory controller 102 to the non-volatile memory 118. An address bus 137 and a data line 140 couples the memory controller 102 to the non-volatile memory 118. Other control and clock signals may exist between the memory controller 102 and non-volatile memory 118 that are not shown in FIG. 1. Furthermore, an address bus 137 and a data line 140 may include multiple lines or bits.

In operation, an ACTIVATE operation for an address can be initiated in non-volatile memory 118. Subsequently, the memory controller 102 initiates READ or WRITE operations in the non-volatile memory 118. The data from non-volatile memory 118 is read after the non-volatile memory ACTIVATE operation is complete.

The ACTIVATE operation in DDR ST-MRAM performs a destructive read where read data in the memory array is reset to logic state "0" during the read process. The read data from the array is stored in local data-store latches at the completion of the ACTIVATE operation. READ/WRITE operations subsequent to the ACTIVATE operation are performed to the local data-store latches instead of the ST-MRAM array. Small time interval, for e.g. 5 nanoseconds, between READ/WRITE operations is feasible due to fast latch operations.

Figure 2:
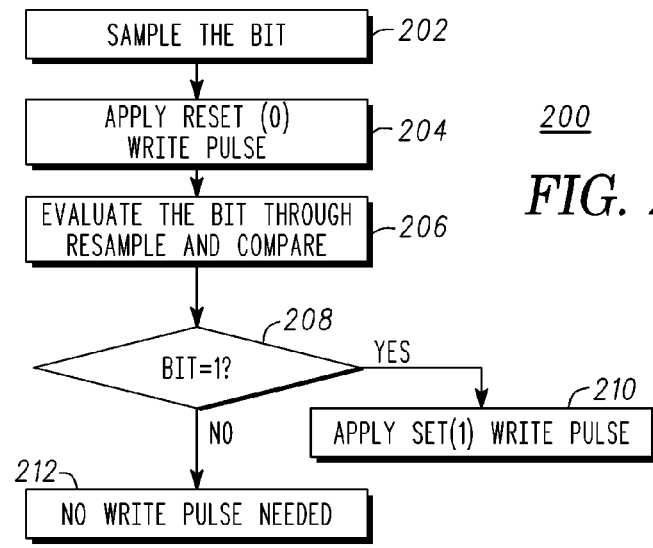
FIG. 2 is a flow chart of the steps for destructive read with immediate write-back in ST-MRAM occurring during an ACTIVATE operation in accordance with a first exemplary embodiment.

FIG. 2 is a flow chart that illustrates an exemplary embodiment of a destructive read operation with an immediate write-back process 200 for restoring read bits of an ST-MRAM memory back to their state prior to the destructive read. For illustrative purposes, the following description of process 200 may refer to elements mentioned above in connection with FIG. 1. It should be appreciated that process 200 may include any number of additional or alternative tasks, the tasks shown in FIG. 2 need not be performed in the illustrated order, and process 200 may be incorporated into a more comprehensive procedure or process having additional functionality not described in detail herein. Moreover, one or more of the tasks shown in FIG. 2 could be omitted from an embodiment of the process 200 as long as the intended overall functionality remains intact.

This first exemplary embodiment of destructive read with immediate write-back in the ST-MRAM array includes first sampling 202 a magnetic bit of the non-volatile memory 118 to provide and store a sampled voltage. An exemplary sample operation is applying a desired voltage, Vbit, across a bit; converting the resulting current through the bit into a voltage, Vsample; and storing Vsample into a capacitor. A reset write current pulse is applied 204 to set the bit to 0 (equivalent to a logic state "0"). The bit state is evaluated 206 by resampling a voltage after step 204 is complete and comparing the resampled voltage with the sampled voltage from step 202. An exemplary resample and evaluate operation is applying the same desired voltage, Vbit, from step 202 across the bit; comparing the resulting current through the bit added with an offset current with the current due to Vsample from step 202 to generate a voltage, Veval; and comparing Veval with Vsample from step 202 to evaluate the bit state. The bit state is thus determined to be either 0 or 1 depending on the sampled voltage levels from 202 and 206. For example, if sampled voltage from 206 is higher than that from step 202, the bit state is 0. The sampled voltage levels can be compared in multiple ways to resolve the bit state. If 208 the bit state is 1, a set write current pulse is applied 210 to set the bit to 1, thus performing an immediate write-back to restore the bit state. If 208 the bit state is not 1, no write pulse is needed 212.

FIG. 3 is a flow chart that illustrates the second exemplary embodiment of a destructive read operation with an immediate write-back process 300 of one page (or equivalently one row) of data comprising of multiple bits. The process 300 is initiated at the beginning of an ACTIVATE operation 302. A sampling 304 multiple magnetic bits of the non-volatile memory 118 provides and stores sampled voltages associated with each bit. Reset write current pulses are applied 306 to reset all the bits in the selected page to 0. The bit states are evaluated 308 by re-sampling voltages after step 306 is completed and the resampled voltages are compared with the sampled voltages from step 304 for each bit. The bit states are thus evaluated to be either 0 or 1 for each bit. A majority state of the bits is determined in 310. If 312 the majority state is 1, i.e., the number bits evaluated to be 1 is higher than the number of bits evaluated to be 0, an inversion status bit is set 314 to 1 for the selected page and all the bit states are inverted 316 and the process proceeds to step 320. If 312 the majority state is not 1, an inversion status bit is set to 0 for the selected page 318 and the process proceeds to 320. For each bit in the page, if 320 the bit state is 1, a set write current pulse is applied 322 to set the bit to 1 thus performing an immediate write-back to restore the bit state in accordance with the inversion status bit set in either 314 or 318. The process 300 is complete 324 after 322. For each bit in the page, if 320 the bit state is 0, no set write current pulse is needed and the process 300 is complete 324.

The second exemplary embodiment in FIG. 3 illustrates using majority detection and page inversion scheme to minimize the number of set write current pulses during the immediate write-back phase, thereby reducing power consumption. An inversion status bit for a page tracks if the page bit states are inverted or not. While it is not shown in FIG.

3, an inversion status with multiple bits may be implemented, for example, three bits where the majority state of the three bits determines the inversion status. The second exemplary embodiment in FIG. 3 and the first exemplary embodiment in FIG. 2 illustrate destructive read where the bit is reset to 0 during the destruction phase. A destructive read may also be implemented where the bit is set to 1 during the destruction phase. In such an alternate embodiment, the second exemplary embodiment in FIG. 3 would be modified to set all the bits to 1 in step 306, and step 312 would check for majority state of 0 instead of 1. Step 320 would check for a bit state of 0, and if 0, would apply 322 a reset write current pulse.

Due to timing constraints of the ACTIVATE operation, write-back pulses may overlap with subsequent operations, primarily READ and WRITE operations. When a WRITE operation, subsequent to the ACTIVATE operation, provides new data for a portion of bits, addressed by column or other address in the open page or row, write-back set write current pulses are aborted only for addressed portion of the bits while the write-back set write current pulses for rest of the bits in the page are unaffected. New set write current pulses (to write 1) or reset write current pulses (to write 0) are initiated in accordance with new data in the addressed portion of the page. New write current pulses can further be initiated conditionally by comparing the new data with previous data from write-back set write current pulses and only when a difference is detected. New write current pulses can further be initiated after a programmable delay to check for any pending WRITE operations to the same portion of the page.

The aforementioned new write current pulses initiated by a WRITE operation subsequent to an ACTIVATE operation can be aborted by a following WRITE operation to the same portion of the bits with different data. This scenario occurs due to back-to-back WRITE operations with a small timing interval, for example five nanoseconds, to the same column address addressing the same portion of the page to write different data bits. Set or reset write current pulses may be longer, for example ten nanoseconds, than the back-to-back WRITE operation interval which will cause a write-abort and initiation of new set or reset write current pulses for new data for the same portion of bits in a page. The initiation of new set or reset write current pulses for new data for the same portion of bits in a page can further be initiated conditionally by comparing the new data with previous data and only when a difference is detected. New set or reset write current pulses can further be initiated after a programmable look-ahead delay to check for any more pending WRITE operations to the same portion of the page. In case of multiple WRITE operations, within the programmable look-ahead delay, to the same portion of the bits in a page, only the last one is executed.

Figure 4:
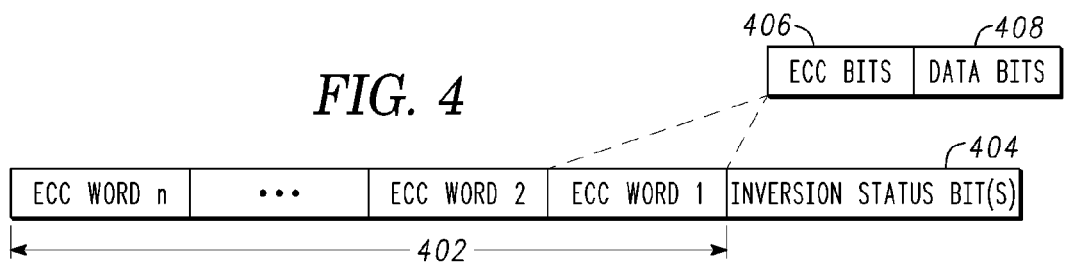
FIG. 4 is an organization of words in a row/page of a bank of non-volatile memory.

A WRITE operation subsequent to an ACTIVATE operation or any other operations, e.g., WRITE, to different portions of the bits in a page will not cause a write-abort since write current pulses (either set or reset) can be executed independently at different times or in parallel for different portions of the bits in a page. Referring to FIG. 4, a known method of organizing a page of bits into multiple error correcting code (ECC) words includes a plurality of ECC words 402 from 1 to n and a word of inversion status bits 404. Each ECC word 402 comprises a plurality of ECC bits 406 and a plurality of data bits 408. In accordance with the present exemplary embodiment, set or reset write current pulses for one ECC word or a group of ECC words can be executed, e.g., initiate, complete, and abort functions, independently at any time. A write clock phase generator coupled to one ECC word or a group of ECC words is used for independent execution of write current pulses. Therefore, a page of bits will be coupled to separate clock phase generators. When a WRITE operation subsequent to an ACTIVATE operation or any other operation provides data for a portion of the bits in page, the portion of the bits will correspond to either one ECC word or multiple ECC words.

In accordance with this exemplary embodiment, to save power during the immediate write-back set write current pulses, a majority detection and page inversion scheme is used to minimize the number of set write current pulses. When a page of bits are organized into multiple ECC words as illustrated in FIG. 4, a majority state (1 or 0) of either data bits and ECC bits in all of the ECC words, or all data bits in all of the ECC words is determined. If the majority state is 1, the read bits are inverted prior to the immediate write-back to the ST-MRAM array, and the inversion status bit(s) for the page in the ST-MRAM array is set to 1 during the immediate write-back phase. If the majority state is 0, the read bits are written-back to the ST-MRAM array, and the inversion status bit(s) for the page in the ST-MRAM array is reset to 0. When a WRITE operation subsequent to an ACTIVATE operation or any other operation provides data for a portion of the bits in page, new data provided for addressed portion of the page are conditionally inverted according to the inversion status bit(s) of the page previously calculated by the majority detection and page inversion scheme during the ACTIVATE operation. A new majority state is not determined during WRITE operations.

Figure 5:
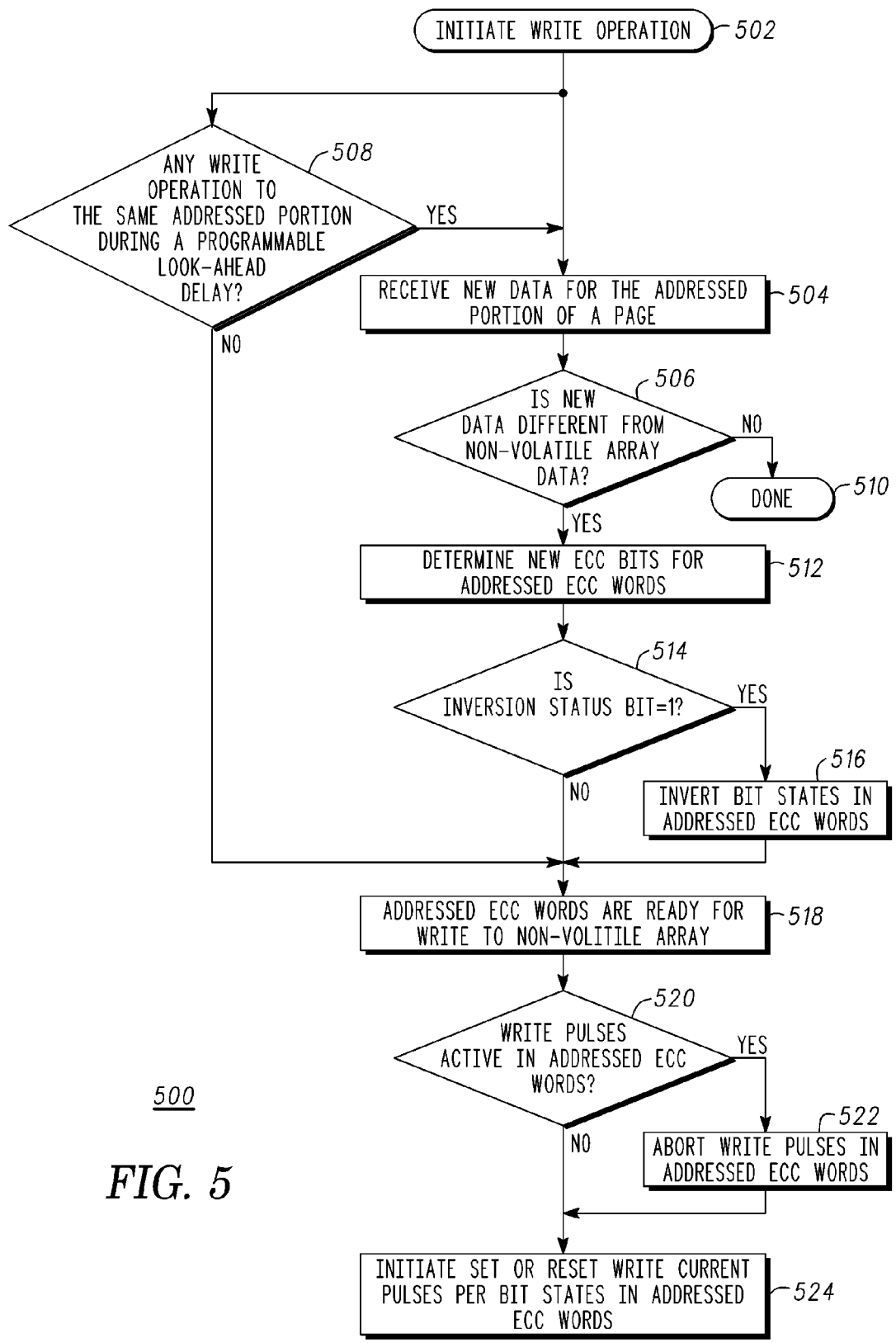
FIG. 5 is a flow chart of the steps occurring during a WRITE operation in accordance with a third exemplary embodiment.

FIG. 5 is a flow chart of the steps occurring during a WRITE operation subsequent to an ACTIVATE operation or any other operation, e.g., a READ or WRITE operation. Specifically, referring to FIG. 5, the method 500 is initiated for a WRITE operation 502 to ST-MRAM. New data for the addressed portion of a page, e.g., column addressing, is received 504. If 506 the new data is not different from ST-MRAM array data for the addressed portion of the page, no write current pulses are needed in the array and hence the process is complete 510. If 506 the new data is different from ST-MRAM array data for the addressed portion of the page, new ECC bits are determined for the addressed ECC words in the page 512. If 514 the inversion status bit for the page is 1, the bit states in the addressed ECC words are inverted 516. If 514 the inversion status bit for the page is not 1, or if the bit states in the addressed ECC words have been inverted 516, addressed ECC words are ready for write to ST-MRAM array 518. Simultaneously with steps 504, 506, 510, 512, 514, 516, if 508 there is any WRITE operation to the same addressed portion of the page during a programmable look-ahead delay period, step 504 is initiated. If 508 there is no WRITE operation to the same addressed portion of the page during a programmable look-ahead delay period, step 518 is completed.

If 520 write pulses are active in the addressed ECC words, the write pulses in the addressed ECC words are aborted 522. If there are no write pulses active in the addressed ECC words 520, or active write pulses in the addressed ECC words are aborted 522, set or reset write current pulses are initiated 524 in accordance with new bit states of the addressed ECC words. The active write pulses in step 520 of method 500 in FIG. 5 can be the write-back set write current pulses of an ACTIVATE operation (step 322 in FIG. 3) in case of a WRITE operation 502 being initiated immediately after an ACTIVATE operation. In case of a back-to-back WRITE operations, the active write pulses in step 520 of method 500 can be the set or reset write current pulses of previous WRITE operation. Method 500 in FIG. 5 illustrates an exemplary embodiment of the present invention where a WRITE operation with a new data for a portion of the open page can abort ongoing write pulses only to the addressed portion without affecting rest of the write pulses if in progress. New write set or reset current pulses are initiated according to new bit states only for the addressed portion of the page either immediately or within a specified time of a look-ahead period to poll for any more WRITE operation to the same addressed portion prior to starting new set or reset write current pulses in response to the original WRITE operation.

Figure 6:
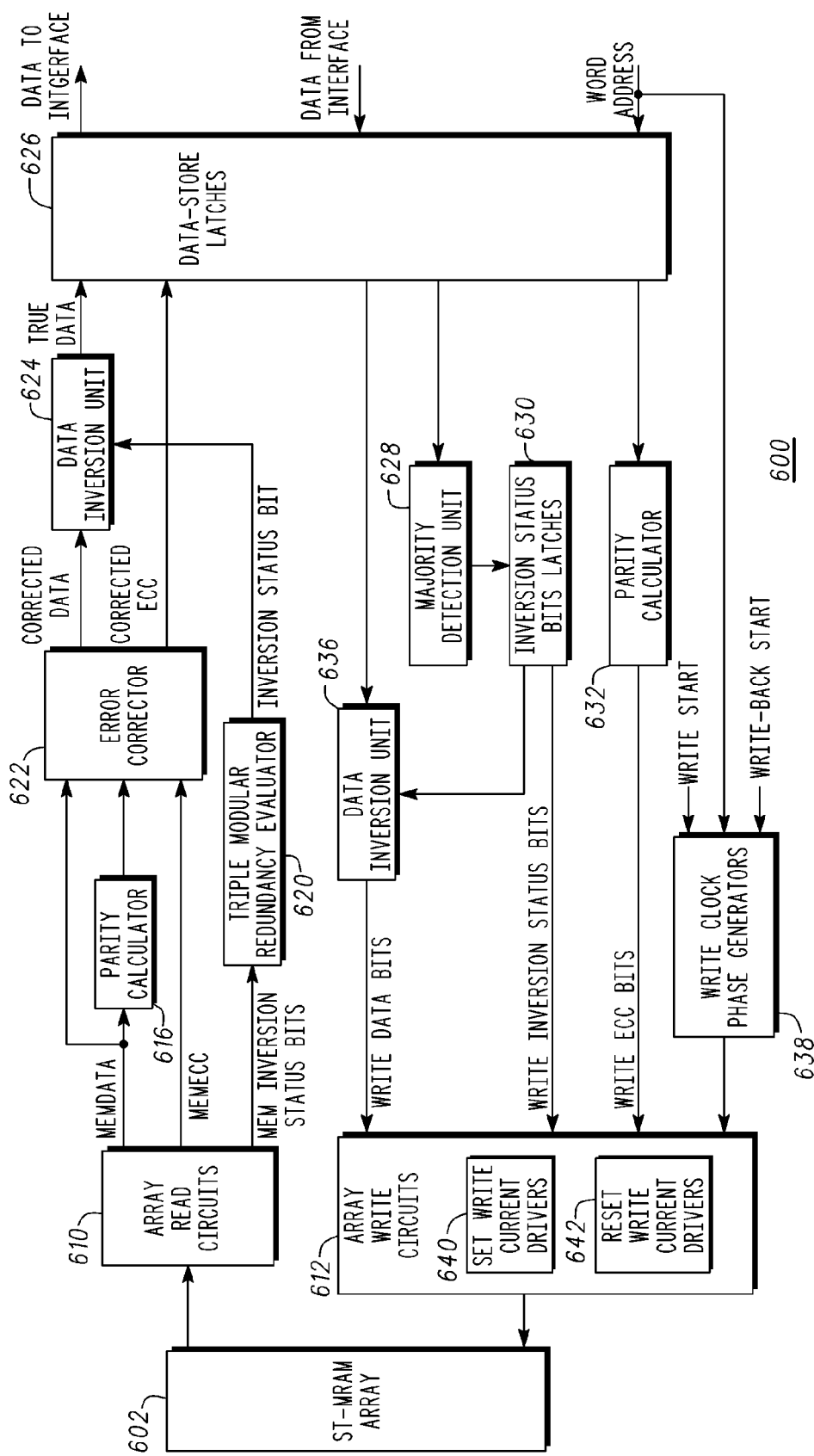
FIG. 6 is a first exemplary embodiment of hardware block diagram implementing the functionalities during ACTIVATE and WRITE operations in accordance with a fourth exemplary embodiment.

FIG. 6 is a first exemplary embodiment of a hardware block diagram of a circuit 600 implementing the functionalities during ACTIVATE and WRITE operations in accordance with an exemplary embodiment. The circuit 600 has an ST-MRAM array 602 coupled to array read circuits 610 and array write circuits 612. Array write circuits 612 further includes set write current drivers 640 and reset write current drivers 642. Circuit 600 also includes a parity calculator 616, a triple modular redundancy evaluator 620, an error corrector 622, a data inversion unit 624, data-store latches 626, a majority detection unit 628, inversion status bits latches 630, a parity calculator 632, a data inversion unit 636, and write clock phase generators 638. For the sake of brevity, other known memory circuitry, for example, row and column address decoders, word line drivers, are not shown in FIG. 6. The hardware block diagram of FIG. 6 also does not show all input and output signals for each circuit block. It is understood that any number of control signals and clocks can couple the circuit blocks to implement the functionalities during ACTIVATE and WRITE operations in accordance with the described embodiment.

During an ACTIVATE operation, array read circuits 610 sense data stored in the ST-MRAM array 602 using a destructive read and provide the data bits, memdata, to parity calculator 616, ECC bits, memecc, to error corrector 622, and inversion status bits, mem inversion status bits, to triple modular redundancy evaluator 620. Each of data, ECC, and inversion status bits comprise multiple bits. Data bits and ECC bits are further organized into multiple ECC words. Error corrector 622 provides corrected data bits to data inversion unit 624 and corrected ECC bits to data-store latches 626. Triple modular redundancy evaluator 620 determines a single inversion status bit from a majority of multiple inversion status bits, for example, three bits. If the inversion status bit is high, data inversion unit 624 inverts and forwards the data, true data, to data-store latches 626. If the inversion status bit is low, data inversion unit 624 does not invert the data while forwarding it, true data, to data-store latches 626. Stored data from data-store latches 626 goes to majority detection circuit 628, data inversion unit 636, and parity calculator 632. The majority detection circuit 628 determines the majority state of the data bits. If the majority state is one, inversion status bits indicating high is generated and stored in 630. Data inversion unit 636 inverts the data if inversion status bit from 630 is high and forwards the inverted data as write data bits to array write circuits 612. If inversion status bit from 630 is low, data inversion unit 636 does not invert the data and forward the data as write data bits to array write circuits 612. Array write circuits 612 also receive inversion status bits from 630 and ECC bits from 632. Write clock phase generators with write-abort and write look-ahead features for different ECC words 638 receives a write-back start signal immediately after the destructive read during the ACTIVATE operation. Write clock phase generators 638 generates control signals and clocks for the set write current drivers 640 to perform immediate write-back of data bits from data inversion unit 636, inversion status bits from inversion status bits latches 630, and ECC bits from parity calculator 632.

Subsequent to an ACTIVATE operation, data-store latches 626 may receive new data for a portion of all the bits corresponding to one or more ECC words during a WRITE operation. New data for the changed ECC words is conditionally inverted by data inversion unit 636 according to inversion status bit from inversion status bits latches 630. Note that the majority detection circuit 628 is not exercised on new data during WRITE. Instead, inversion status bits latches 630 provide a previously stored inversion status bit from ACTIVATE operation to data inversion unit 636. New parity bits are determined for the changed ECC words by parity calculator 632. Write clock phase generators 638 receive a write start signal to initiate the write operation for the changed ECC words. Write clock phase generators 638 implements logic function that first checks if set or reset write current pulses in the changed ECC words are active. Any active set or reset write current pulses are aborted only for the changed ECC words while the set or reset write current pulses in the other ECC words are not affected. Any active set or reset write current pulses for the changed ECC words may be aborted as soon as data for the changed ECC words are provided in data-store latches 626. New set or reset write current pulses may start for the changed ECC words by set write current drivers 640 or reset write current drivers 642 according to new data from data inversion unit 636 and ECC from parity calculator 632. Hence, write clock generators 638 employs separate clock phase generators for each ECC word. In another embodiment, write clock phase generators 638 may use a number of clock phase generators multiplexed to multiple ECC words instead of one clock phase generator per ECC word.

The write clock phase generators 638 further implement the write look-ahead feature where new write current pulses are not initiated immediately during the first WRITE operation. A programmable delay period allows for polling for any more WRITE operation for the same or different ECC words. Multiple WRITE operations during the programmable delay to the same ECC word can be accumulated to generate set and/or reset write pulses only for the last WRITE operation. Multiple WRITE operations during the programmable delay to different ECC words can be accumulated to generate set and/or reset pulses for all the changed ECC words during the last WRITE operation. In another embodiment, the majority detection circuit 628 may use both data and ECC bits to determine the majority state and generate inversion status bits for inversion status bits latches 630.

It has been shown that an immediate write-back may be performed to bits of a ST-MRAM array after a destructive read. An abort of the write-back operation may be made in response to receiving a new WRITE operation to one or more ECC words while write-back operation for other ECC word continues. Write power consumption may be saved by a majority detection and inversion of the write-back states to minimize the number of write-back pulses. WRITE operations subsequent to the write-back operation follows the inversion status determined during the write-back operation. New set write current pulses or reset write current pulses during WRITE operations are initiated only for the changed portion of bits in accordance with new data and inversion status determined during the write-back operation. New write current pulses can further be initiated after a programmable delay to check for any pending WRITE operations to the same or any other portion of the bits.

While at least one exemplary embodiment has been presented in the foregoing detailed description, it should be appreciated that a vast number of variations exist. For example, immediate write-back of only the data bits and not the ECC bits may be performed after a destructive read. ECC bits may be written to the ST-MRAM array at a later time, for example, during PRECHARGE operation. In another embodiment, immediate write-back after a destructive read may not be aborted with data from WRITE commands. Data and ECC from WRITE commands may be written to the ST-MRAM array at a later time, for example, during PRECHARGE operation, only if data and ECC bit states changed from immediate write-back states. Immediate write-back pulses and write pulses may be staggered in time to minimize peak current. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A memory, comprising:
    an array of bits; and
    array read circuits coupled to the array of bits, the array read circuits configured to:
        sample bits in a page within the array of bits, wherein sampling provides a sampled voltage for each of the bits in the page, wherein the array read circuits are configured to sample each bit in the page by applying a first voltage across the bit and converting current resulting from applying the first voltage to the sampled voltage;
        after sampling the bits in the page, apply a first write current pulse to each of the bits in the page to set all of the bits in the page to a first logic state;
        after applying the first write current pulse to each of the bits in the page, resample each of the bits in the page to provide a resampled voltage for each bit in the page, wherein the array read circuits are configured to resample each bit by reapplying the first voltage across the bit and adding an offset current to a current resulting from reapplying the first voltage across the bit, wherein the array read circuits are configured to generate the resampled voltage for each bit using the offset current and the current resulting from reapplying the first voltage across the bit; and
        for each bit in the page, compare the resampled voltage with the sampled voltage to determine a bit state for the bit, wherein the bit state for each bit is either the first logic state or a second logic state.

2. The memory of claim 1 further comprising array write circuits coupled to the array of bits, the array write circuits configured to, for each of the bits in the page having the second logic state, initiate an immediate write-back after the array read circuits determine the bit state for all of the bits in the page, wherein the immediate write-back is initiated prior to the memory receiving a read operation or a write operation having an address corresponding to bits in the page, wherein the immediate write-back for each bit includes applying a second write current pulse to set the bit to the second state.

3. The memory of claim 2, wherein the array write circuits are configured to abort the immediate write-back for at least a portion of the bits in the page in response to the memory receiving a write operation corresponding to the portion of the bits in the page.

4. The memory of claim 2, wherein the array write circuits are further configured to initiate new write-back write current pulses for a portion of the bits in the page in accordance with new data included in a write operation received by the memory after initiation of the immediate write-back.

5. The memory of claim 4, wherein the array write circuits are configured to initiate the new write-back write current pulses after a programmable delay.

6. The memory of claim 2, wherein the array write circuits are configured to apply second write current pulses for different portions of the page at different times such that the second write current pulses are staggered during the immediate write-back.

7. The memory of claim 1, further comprising a data inversion unit coupled to the array read circuits, wherein the data inversion unit is configured to selectively invert the states for the bits in the page based on an inversion status bit for the page.

8. The memory of claim 1, further comprising:
    a parity calculator coupled to the array read circuits; and
    an error corrector coupled to the parity calculator and the array read circuits.

9. The memory of claim 1, wherein the memory is a non-volatile memory.

10. The memory of claim 9, wherein the memory is a spin-torque magnetic random access memory.

11. The memory of claim 1 further comprising a plurality of data store latches coupled to the array read circuits, wherein the bit state for each bit in the page is stored in a corresponding one of the plurality of data store latches after the bit state is determined by the array read circuits.

12. The memory of claim 11, wherein the memory stores the bit states for the bits in the page in the data store latches during an activate operation.

13. The memory of claim 11 further comprising a majority detection unit coupled to the plurality of data store latches, wherein the majority detection unit determines a majority state of the bits in the page.

14. A non-volatile memory, comprising:
    an array of non-volatile bits;
    array read circuits coupled to the array of non-volatile bits, the array read circuits configured to:
        sample non-volatile bits in a page within the array of non-volatile bits, wherein sampling provides a sampled voltage for each of the non-volatile bits in the page, wherein the array read circuits are configured to sample each non-volatile bit in the page by applying a first voltage across the non-volatile bit and converting current resulting from applying the first voltage to the sampled voltage;
        after sampling the non-volatile bits in the page, apply a first write current pulse to each of the non-volatile bits in the page to set all of the non-volatile bits in the page to a first logic state;
        after applying the first write current pulse to each of the non-volatile bits in the page, resample each of the non-volatile bits in the page to provide a resampled voltage for each non-volatile bit in the page, wherein the array read circuits are configured to resample each non-volatile bit in the page by reapplying the first voltage across the non-volatile bit and adding an offset current to a current resulting from reapplying the first voltage across the non-volatile bit, wherein the array read circuits are configured to generate the resampled voltage for each non-volatile bit using the offset current and the current resulting from reapplying the first voltage across the non-volatile bit; and for each non-volatile bit in the page, compare the resampled voltage with the sampled voltage to determine a bit state for the non-volatile bit, wherein the bit state for each non-volatile bit is either the first logic state or a second logic state; and array write circuits coupled to the array of non-volatile bits, the array write circuits configured to:

after determining the bit states for the non-volatile bits in the page, for each of the non-volatile bits in a first portion of the page having the second logic state, initiate a first write-back to set the non-volatile bit to the second state.

15. The non-volatile memory of claim 14, wherein the array write circuits are further configured to:

for each of the non-volatile bits in a second portion of the page having the second logic state, initiate a second write-back to set the non-volatile bit in the memory to the second state, wherein the second write-back is initiated at a different time than the first write-back such that first write-back and the second write-back are staggered in time.

16. The non-volatile memory of claim 14 further comprising:

a plurality of data store latches coupled to the array read circuits and the array write circuits, wherein the bit state for each non-volatile bit in the page is stored in a corresponding one of the plurality of data store latches after the bit state is determined by the array read circuits; and a majority detection unit coupled to the plurality of data store latches, wherein the majority detection unit determines a majority state of the non-volatile bits in the page.

17. A method of operation of a memory, the method comprising:

sampling bits to provide a sampled voltage for each of the bits, wherein the bits sampled correspond to a page within an array of bits in the memory, wherein, for each bit in the page, sampling includes:
applying a first voltage across the bit; and
converting current resulting from applying the first voltage to the sampled voltage for the bit;

after sampling the bits, applying a reset write current pulse to each of the bits to reset all of the bits in the page to a first logic state;

after applying the reset write current pulse to each of the bits, resampling each of the bits in the page to provide a resampled voltage for each bit, wherein, for each bit in the page, resampling includes:
reapplying the first voltage across the bit;
adding an offset current to a current resulting from reapplying the first voltage across the bit; and
generating the resampled voltage for each bit using the offset current and the current resulting from reapplying the first voltage across the bit; and for each bit in the page, determining a bit state for the bit based on the resampled voltage and the sampled voltage, wherein the bit state for each bit is either the first logic state or a second logic state.

18. The method of claim 17, further comprises:
after determining the bit state for each bit, initiating a write-back to the array of bits, wherein the write-back includes:
for each of the bits of the page having the second logic state, applying a set write current pulse to set the bit in the memory to the second state.

19. The method of claim 18 further comprises applying the set write current pulses for different portions of the page at different times such that the set write current pulses are staggered during the write-back.

20. The method of claim 18, wherein the set write current pulses and the reset write current pulses are of opposite polarity.

* * * * *